United States Patent [19]

Gruender, Jr.

[11] Patent Number: 5,270,970
[45] Date of Patent: Dec. 14, 1993

[54] MEMORY DEVICE HAVING A BUFFER FOR GATING DATA TRANSMISSIONS

[75] Inventor: Eugene H. Gruender, Jr., Austin, Tex.

[73] Assignee: Motorola, Inc., Schaumburg, Ill.

[21] Appl. No.: 669,812

[22] Filed: Mar. 15, 1991

[51] Int. Cl.⁵ .............................................. G11C 7/00
[52] U.S. Cl. .......................... 365/189.05; 365/230.08
[58] Field of Search ................ 365/189.05, 189.08, 365/189.03, 189.01, 230.08

[56] References Cited

U.S. PATENT DOCUMENTS

| | | | |
|---|---|---|---|
| 4,602,356 | 7/1986 | Nozaki et al. | 365/230.08 |
| 4,761,730 | 8/1988 | Ng et al. | 364/200 |
| 4,951,251 | 8/1990 | Yamaguchi et al. | 365/189.02 |

OTHER PUBLICATIONS

Mitsubishi Electronics, Jul. 1990; VLSI MOS Memory RAM/ROM & Memory Cards.

*Primary Examiner*—Steven Mottola
*Attorney, Agent, or Firm*—Harold C. McGurk, IV; Walter W. Nielsen; Raymond J. Warren

[57] ABSTRACT

A device has a plurality of memory portions, a first portion having an output enable and input/output connections and a second portion without output enables and having separate input and output connections. A tri-state buffer has its input coupled to the output connection of the second memory portion and its output coupled to the input connection of the second memory portion. A control connection of the buffer is coupled to the output enable of the device.

15 Claims, 4 Drawing Sheets

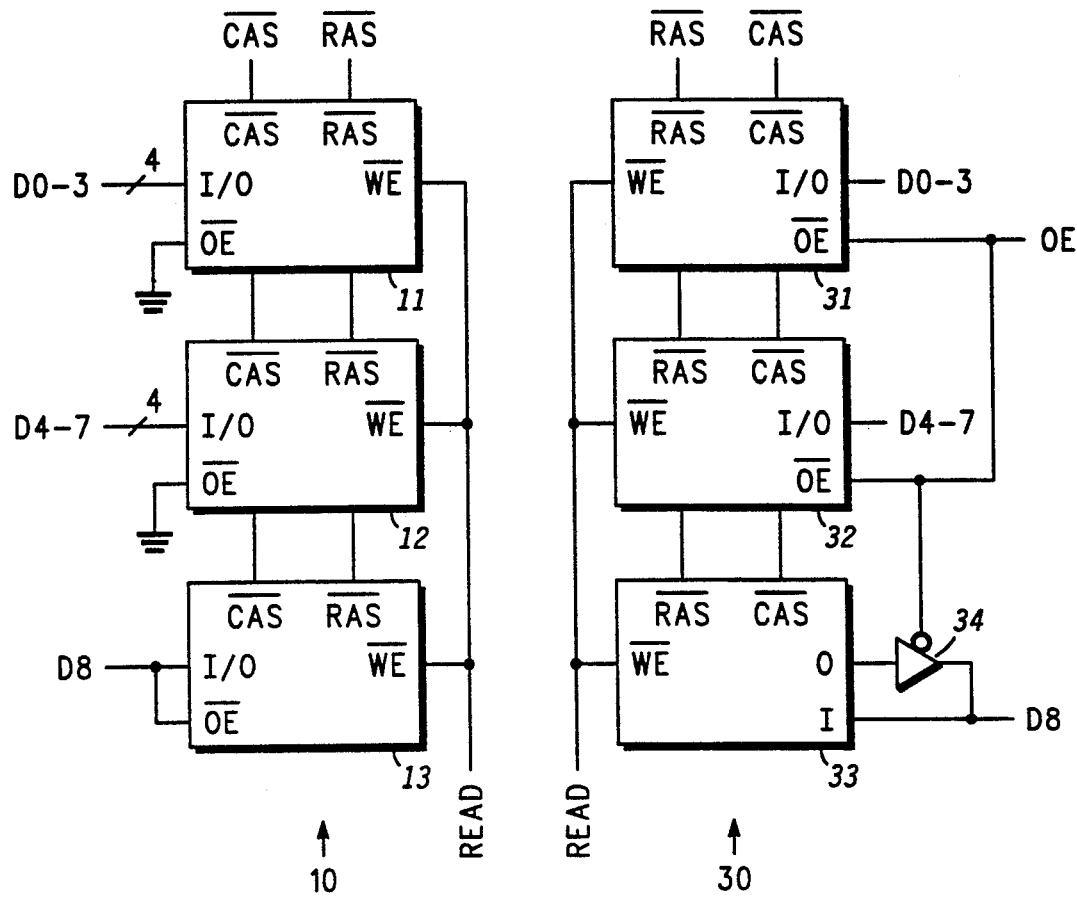
FIG. 1
-PRIOR ART-
FIG. 3A
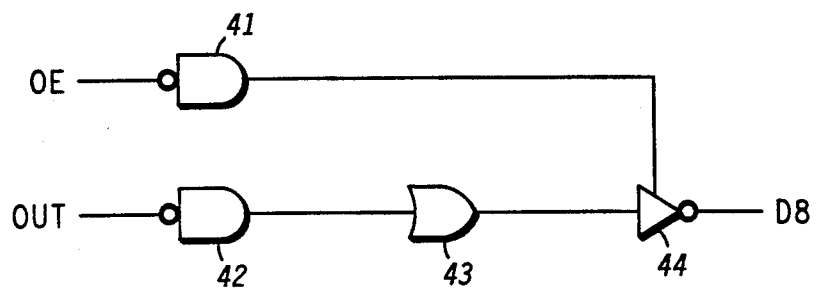
FIG. 3B

MEMORY DEVICE HAVING A BUFFER FOR GATING DATA TRANSMISSIONS

FIELD OF THE INVENTION

The present invention relates, in general, to memory devices, and, more particularly, a memory devices having read-modify-write features.

BACKGROUND OF THE INVENTION

Currently, a read-modify-write process for a memory device requires two cycles, one to read and the other to write. This is required because many of the memory devices do not have an output enable which would permit the read-modify-write operation to occur in one cycle.

For example, a 36-bit memory device would be comprised of 8 X4 DRAMs (dynamic random access memories) and 4 X1 DRAMs. The X4 DRAMs are used to store the data and the X1 DRAMs are used to store the parity or the error correction data. Because the X1 DRAMs do not have output enable lines, a read-modify-write must be conducted as separate read and write functions.

SUMMARY OF THE INVENTION

A memory device is provided having a DRAM with an output enable line and a DRAM without an output enable line. The output of the DRAM device without the output enable is coupled through a three-state buffer gate to its input line. The control line of the buffer is coupled to an output enable line of the memory device.

BRIEF DESCRIPTION OF THE DRAWINGS

FIG. 1 is a block diagram of a prior art memory device;

FIG. 3A is a block diagram of a memory device embodying the present invention;

FIG. 3B is a block diagram of the output portion of said memory device of FIG. 3A when implemented using a PAL (Programmable Array Logic) device;

DETAILED DESCRIPTION OF THE DRAWINGS

Referring initially to FIG. 1, a block diagram of a prior art memory device, generally designated 10, is illustrated. Memory device 10 consists of two X4 memories, and 12, and a X1 memory 13. All three of the memories have RAS (Row Access Strobe) and CAS (Column Access Strobe) input lines. Memory 11 has four input/output lines (D0-3) and an OE (Output Enable) line which is coupled to ground. Memory 12 has four input/output lines (D4-7) and an OE line coupled to ground. Memory 13 has separate input and output lines which are coupled together outside the device to receive and transmit on bit line D8.

Figure 2:
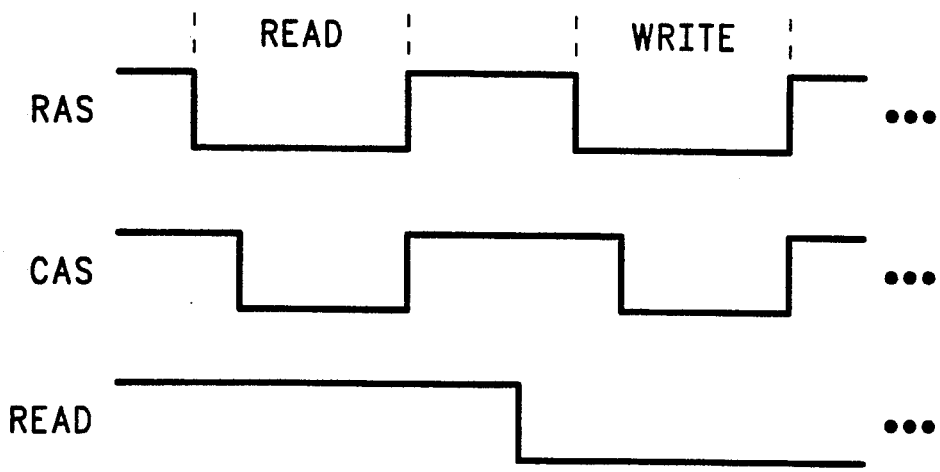
FIG. 2 is a timing diagram of a read-modify-write process for the prior art memory device of FIG. 1.

In order to perform a read-modify-write procedure, the prior art memory device of FIG. 1 must use a standard read-write procedure set out in the timing diagram of FIG. 2. First, the read signal is set high. Then the read cycle occurs. This consists of inputting a row address when the RAS signal transitions from high to low. Next, the column address is input when the CAS signal transitions from high to low. In order to write the data back to memory, whether modified or not, the read line must be taken low while the RAS and CAS strobes clock in the row and column addresses, respectively.

Referring now to the memory device, generally designated 30, of FIG. 3A, a configuration embodying the present invention is illustrated. This configuration also consists of a pair of X4 memories, 31 and 32, and a X1 memory 33. However, in device 30, a tri-state buffer 34 has been added in the output line of memory 33. Tri-state buffer 34 has its input coupled to the output of memory 33; its output coupled to the input line of device 33; and its control line coupled to an output enable line. Memories 31 and 32 also have their output enable lines coupled to the output enable line rather than to ground, as in the prior art FIG. 1.

Figure 4:
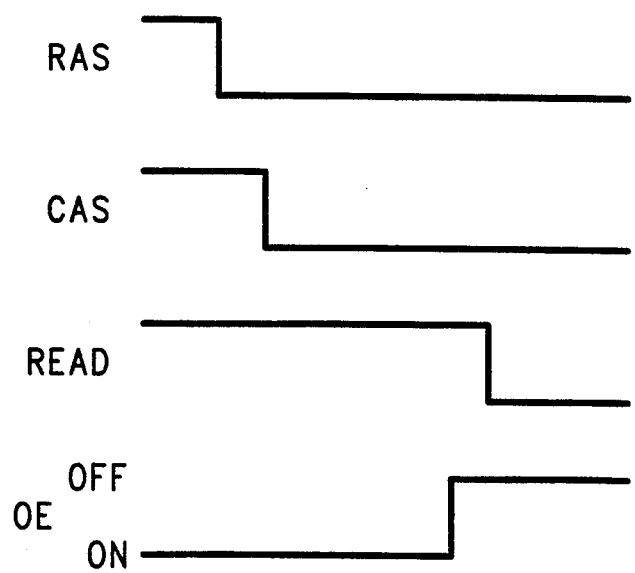
FIG. 4 is a timing diagram of a read-modify-write process for the memory device of FIG. 1.

The configuration of FIG. 3A permits a read-modify-write to occur within one cycle as opposed to two separate cycles as in the prior art. This is illustrated in the timing diagram of FIG. 4. With the read signal set high, signals on the RAS and CAS lines clock in the row and address, respectively, of the memory cell to be accessed. At the same time, the output enable signal is high to permit the data to be output from the memories. Data may be written back to the same address (which is the function of the read-modify-write process) by turning the output enable off and by transitioning the read signal to a write mode. The data present on the data lines is then stored in memory.

With regard to the operation of memory 33 of FIG. 3A, the output enable is coupled to the control input of buffer 34. Therefore, when output enable is on, the output line of device 33 is gated open by buffer 34. When the output enable is off, the data from the output is inhibited by buffer 34.

An alternative implementation of the output portion of memory device 33, implemented using a PAL device, is illustrated in FIG. 3B. Here, the input of a low trigger AND gate 41 is coupled to the OE input. The output of AND gate 41 is coupled to the control input of a buffer 44. The OUT signal of a memory is coupled through a second low trigger AND gate 42 and an OR gate 34 to the input of buffer 44. The output of buffer 44 is inverted to provide the D8 output signal. The PAL programming code for this device is set forth in TABLE A.

TABLE A

Programmable Array Logic Code $\overline{D8} = \overline{OUT}$ $\overline{D8}.trst = \overline{OE}$ Where $\overline{D8}.trst$ is the control input to tri-state buffer 44.

This type of implementation is often preferable when a PAL is already located in the system for other purposes.

Figure 5A:
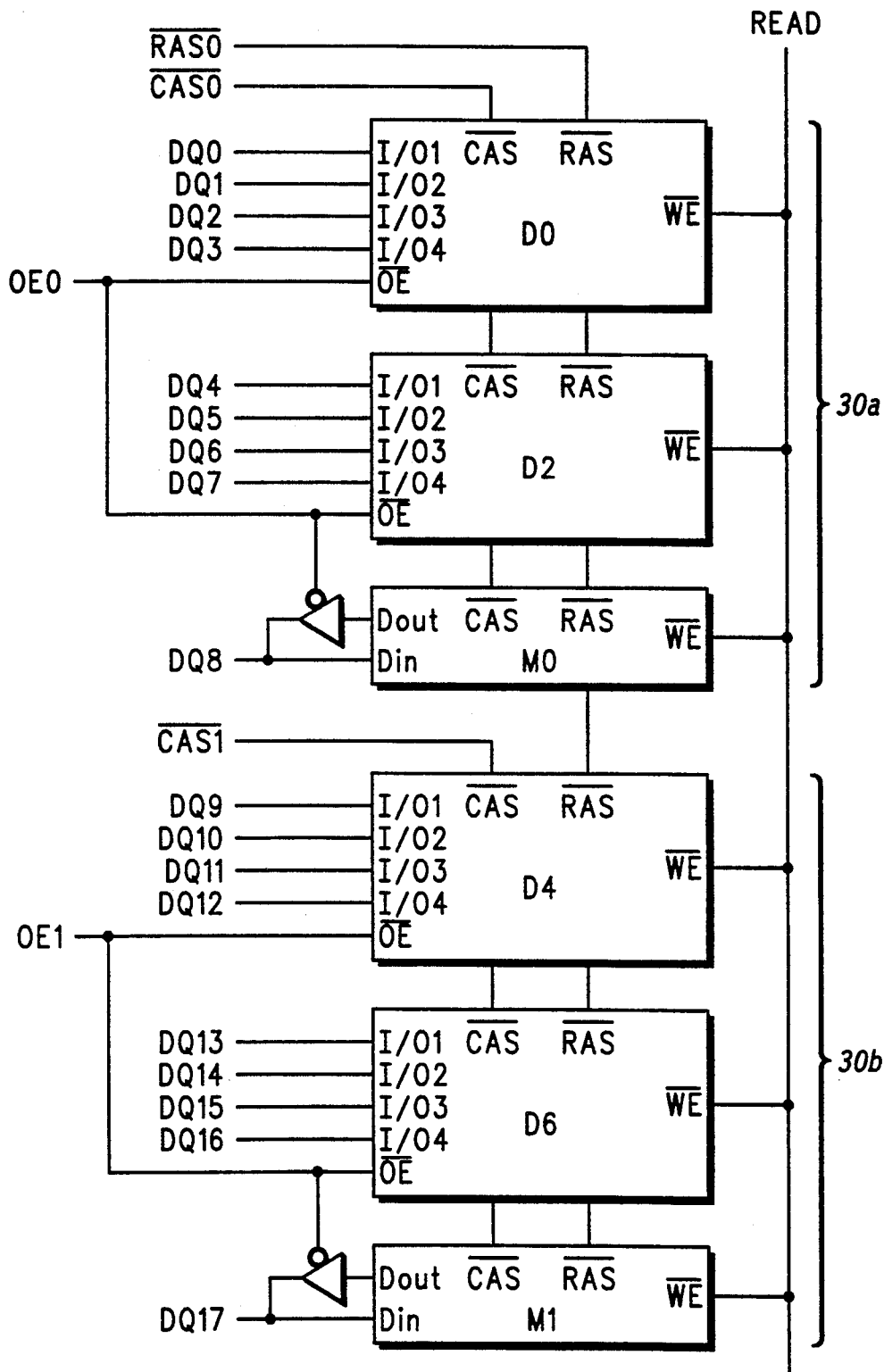
FIGS 5A and 5B is a block diagram of a memory device for a 36-bit SIMM (Single In-line Memory Module) embodying the present invention.
Figure 5B:
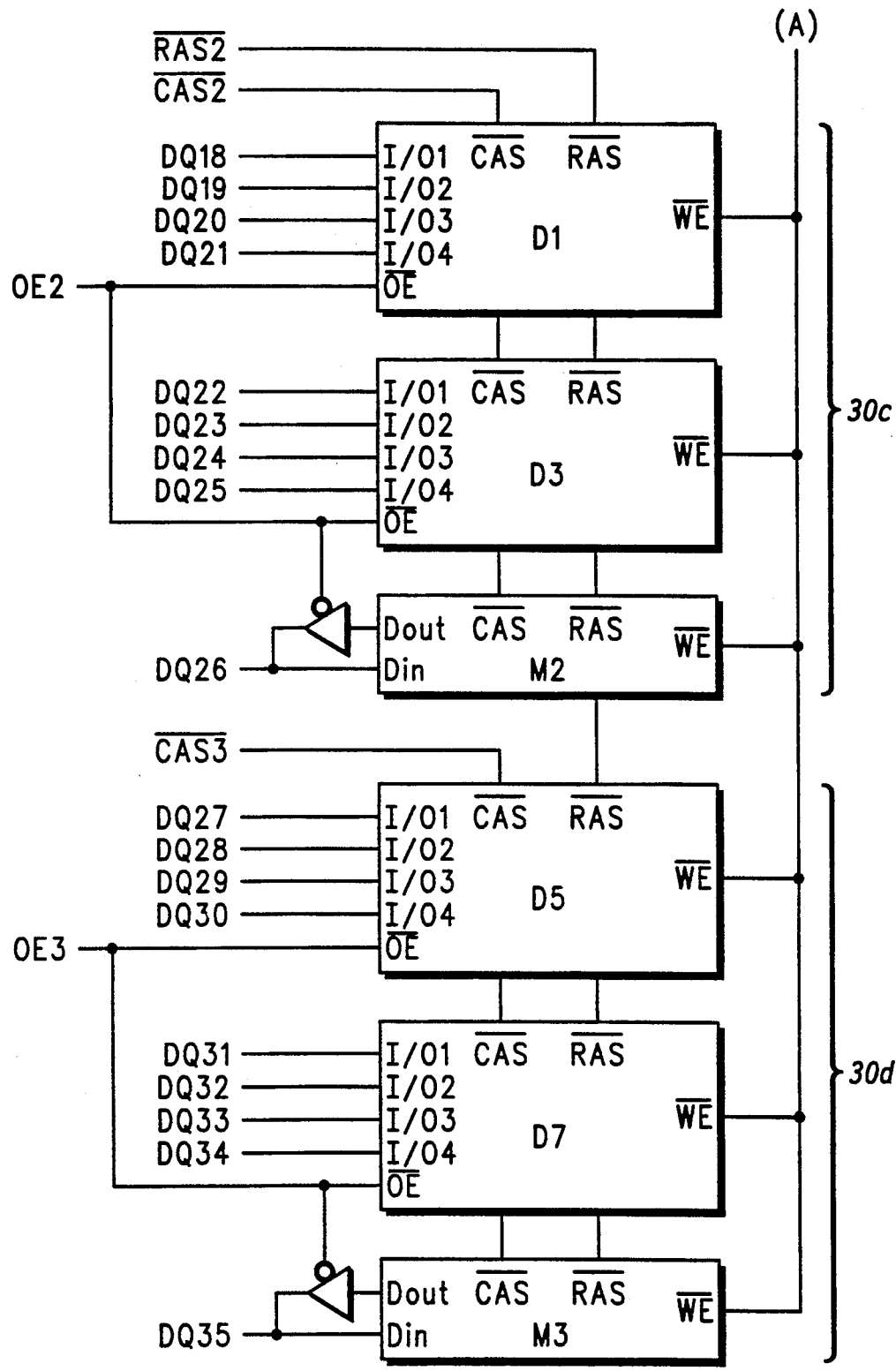

Another embodiment of the present invention is found in FIG. 5. This memory configuration, generally designated 50, is a 36-bit configuration. This is for a 32-bit data and 4-bit parity or error correction words and is comprised of four memory devices (30a–30d) as shown in FIG. 3. Presently the 32-bit configuration operates on two 16-bit data words each having 2 parity bits. However, this can be modified to one 32-bit word configuration.

Configuration 50 would find application in a single in-line memory module (SIMM) package, such as shown in U.S. Pat. No. 4,656,605, and incorporated herein by reference.

Thus, it will be apparent to one skilled in the art, upon reviewing the foregoing description, that there has been provided in accordance with the invention, a device that fully satisfies the objects, aims, and advantages.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

I claim:

1. A memory device comprising:
   first memory means for storing data having an input/output and an output enable;
   second memory means for storing data having an input and an output; and
   buffer means for gating data transmissions, said buffer means having an input coupled to said output of said second memory means, an output coupled to said input of said second memory means, and a control coupled to said output enable of said first memory means.

2. The memory device of claim 1 wherein said first memory means further comprises a row address strobe and a column address strobe.

3. The memory device of claim 1 wherein said second memory means further comprises a row address strobe and a column address strobe.

4. The memory device of claim 1 wherein said buffer means is a tri-state buffer.

5. The memory device of claim 1 wherein said buffer means comprises a programmable array logic device.

6. The memory device of claim 5 wherein said programmable array logic device comprises:
   a first AND gate having an input coupled to said output enable of said first memory means and an output;
   a second AND gate having an input coupled to said output of said second memory means and an output;
   an OR gate having an input coupled to said output of said second AND gate and an output; and
   a tri-state buffer having an input coupled to said output of said OR gate, a control input coupled to said output of said first AND gate, and an output coupled to an output of said memory device.

7. A memory device having a plurality of data input/output lines and an output enable, said memory device comprising:
   first memory means for storing data having an input/output line coupled to one of said plurality of data input/output lines of said memory device and an output enable coupled to said output enable of said memory device;
   second memory means for storing data having an input and an output, both coupled to one of said plurality of data input/output lines of said memory device; and
   buffer means for gating data transmissions, said buffer means having an input coupled to said output of said second memory means, an output coupled to said input of said second memory means, and a control coupled to said output enable of said memory device.

8. The memory device of claim 7 having a row address strobe and a column address strobe coupled respectively to a row address strobe and a column address strobe of each of said first and second memory means.

9. The memory device of claim 7 wherein said buffer means comprises a tri-state buffer.

10. The memory device of claim 7 wherein said buffer means comprises a programmable array logic device.

11. The memory device of claim 10 wherein said programmable array logic device comprises:
   a first AND gate having an input coupled to said output enable of said first memory means and an output;
   a second AND gate having an input coupled to said output of said second memory means and an output;
   an OR gate having an input coupled to said output of said second AND gate and an output; and
   a tri-state buffer having an input coupled to said output of said OR gate, a control input coupled to said output of said first AND gate, and an output coupled to one of said plurality of input/output lines of said memory device.

12. A memory device comprising:
   first memory means for storing data having an input and an output;
   buffer means for gating data transmissions, said buffer means having an input coupled to said output of said first memory means, an output coupled to said input of said first memory means, and a control; and
   second memory means for storing data having an input/output and an output enable coupled to said control of said buffer means.

13. The memory device of claim 12 wherein said buffer means comprises a tri-state buffer.

14. The memory device of claim 12 wherein said buffer means comprises a programmable array logic device.

15. The memory device of claim 14 wherein said programmable array logic device comprises:
   a first AND gate having an input coupled to said output enable of said second memory means and an output;
   a second AND gate having an input coupled to said output of said first memory means and an output;
   an OR gate having an input coupled to said output of said second AND gate and an output; and
   a tri-state buffer having an input coupled to said output of said OR gate, a control input coupled to said output of said second AND gate, and an output coupled to an output of said memory device.

* * * * *